(12) United States Patent
Chen et al.

(10) Patent No.: US 7,923,340 B2
(45) Date of Patent: Apr. 12, 2011

(54) METHOD TO REDUCE COLLECTOR RESISTANCE OF A BIPOLAR TRANSISTOR AND INTEGRATION INTO A STANDARD CMOS FLOW

(75) Inventors: Alan S. Chen, Windermere, FL (US); Mark Dyson, Singapore (SG); Nace M. Rossi, Singapore (SG); Ranbir Singh, Singapore (SG); Xiaojun Yuan, Singapore (SG)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 12/523,368

(22) PCT Filed: Feb. 14, 2007

(86) PCT No.: PCT/US2007/062100
§ 371 (c)(1),
(2), (4) Date: Jul. 16, 2009

(87) PCT Pub. No.: WO2008/100312
PCT Pub. Date: Aug. 21, 2008

(65) Prior Publication Data
US 2010/0065920 A1  Mar. 18, 2010

(51) Int. Cl.
*H01L 21/331* (2006.01)
*H01L 21/8222* (2006.01)

(52) U.S. Cl. ............... 438/318; 438/320; 257/E21.371; 257/E21.131

(58) Field of Classification Search .................. 438/204, 438/235, 318, 320, 341; 257/E21.696, E21.371, 257/E21.131, E21.133, E21.379
See application file for complete search history.

(56) References Cited

U.S. PATENT DOCUMENTS

| | | |
|---|---|---|
| 5,350,939 A | 9/1994 | Honda et al. |
| 5,838,048 A | 11/1998 | Hirai et al. |
| 6,184,094 B1 | 2/2001 | Goto |
| 2003/0001234 A1 | 1/2003 | Fujii |
| 2006/0131693 A1 | 6/2006 | Kim |

FOREIGN PATENT DOCUMENTS

| | | |
|---|---|---|
| EP | 0451632 A2 | 3/1991 |
| EP | 0708482 A2 | 10/1995 |
| EP | 0948046 A1 | 3/1999 |
| WO | 2008100312 A1 | 8/2008 |

OTHER PUBLICATIONS

PCT Search Report dated Oct. 22, 2007 for PCT/US2007/062100; 4 Pages.

*Primary Examiner* — Walter L Lindsay, Jr.

(57) ABSTRACT

The invention, in one aspect, provides a method for fabricating a semiconductor device. In one aspect, the method provides for a dual implantation of a tub of a bipolar transistor. The tub in bipolar region is implanted by implanting the tub through separate implant masks that are also used to implant tubs associated with MOS fabricate different voltage devices in a non-bipolar region during the fabrication of MOS transistors.

18 Claims, 4 Drawing Sheets

METHOD TO REDUCE COLLECTOR RESISTANCE OF A BIPOLAR TRANSISTOR AND INTEGRATION INTO A STANDARD CMOS FLOW

CROSS-REFERENCE TO RELATED APPLICATIONS

This application claims priority of International Application No. PCT/US2007/062100, entitled "METHOD TO REDUCE COLLECTOR RESISTANCE OF A BIPOLAR TRANSISTOR AND INTEGRATION INTO A CMOS FLOW", filed on Feb. 14, 2007. The above-listed application is commonly assigned with the present invention and is incorporated herein by reference as if reproduced herein in its entirety.

TECHNICAL FIELD

The invention is directed, in general, to a semiconductor device and a method of manufacturing that device and, more specifically, to a bipolar device and method to reduce collector resistance while integrating the device into a metal oxide semiconductor (MOS) flow.

BACKGROUND

Optimization of semiconductor devices continues to be an important goal for the semiconductor industry. The continued miniaturization of semiconductor devices, such as bipolar transistors, presents ongoing challenges to semiconductor manufacturers in maintaining or improving that optimization while maintaining product yields and minimizing production time and costs. One such challenge resides in reducing the high collector resistance associated with bipolar transistors, such as vertical PNP (VPNP) bipolar transistors. The collector resistance limits the minimum saturation voltage (Vcesat) of the VPNP transistor. Minimum Vcesat is desired for maximum headroom and lower power consumption of a transistor. Further, this higher resistance is undesirable because it can adversely affect device speed and overall device performance, and as device sizes continue to shrink, this resistance will have even a greater impact.

Accordingly, there is a need to provide a process and device by which the resistance can be reduced in a bipolar transistor without affecting other components that might be present in the device.

SUMMARY

To address the above-discussed deficiencies, in one embodiment, there is provided a method of manufacturing a semiconductor device. This embodiment includes forming openings in a first implant mask located over a bipolar region and a first non-bipolar region of a semiconductor substrate to expose a bipolar region portion and the first non-bipolar region. A first implant is conducted to implant a dopant through the openings and into the semiconductor substrate to form tubs in the bipolar region portion and tubs in the first non-bipolar region. Openings are formed in a second implant mask located over the bipolar region portion and a second non-bipolar region to expose the tubs in the bipolar region portion and expose the second non-bipolar region, the tubs of the first non-bipolar region being protected by the second implant mask. This is followed by a second implant that is conducted through the openings to place the dopant in the tubs in the bipolar region and form tubs in the second non-bipolar region, such that the dopant concentration in the tubs of the bipolar region is greater than the dopant concentration in the tubs of the second non-bipolar region.

In another embodiment, there is provided a bipolar transistor region, including collector contact tubs located in a semiconductor substrate. The collector contact tubs each have a dopant concentration ranging from about 1E17 atoms/cm$^3$ to about 6E18 atoms/cm$^3$, and wherein the depth of the dopant concentrations ranges from about 0 nm to about 1000 nm. This embodiment further includes a non-bipolar transistor region, including transistor tubs located in a semiconductor substrate, source/drains located in each of the transistor tubs, and a gate electrode located over each of the transistor tubs. The transistor tubs have a dopant concentration within the depth range that is less than the collector contact tubs.

In another embodiment, a method is provided that comprises forming openings in a first implant mask located over a vertical bipolar transistor region and a first NMOS transistor region of a semiconductor substrate to expose a portion of the vertical transistor bipolar region and the first NMOS transistor region. A first implant is conducted through the openings to place a dopant in the semiconductor substrate to form tubs in the portion of the vertical bipolar transistor region and the first NMOS transistor region. Openings are formed in a second implant mask located over the vertical bipolar transistor region and a second NMOS transistor region to expose the tubs in the vertical bipolar transistor region and the second NMOS transistor region. A second implant is conducted through the openings to place the dopant in the tubs of the vertical bipolar transistor region and form tubs in the second NMOS transistor region, such that the dopant concentration in the tubs of the vertical bipolar transistor region is greater than the dopant concentration in the tubs of the second NMOS transistor region.

The foregoing has outlined certain embodiments so that those skilled in the art may better understand the detailed description that follows. Additional embodiments and features are described hereinafter that form the subject of the claims. Those skilled in the art should appreciate that they can readily use the disclosed conception and specific embodiment as a basis for designing or modifying other structures for carrying out the same purposes as set forth herein.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
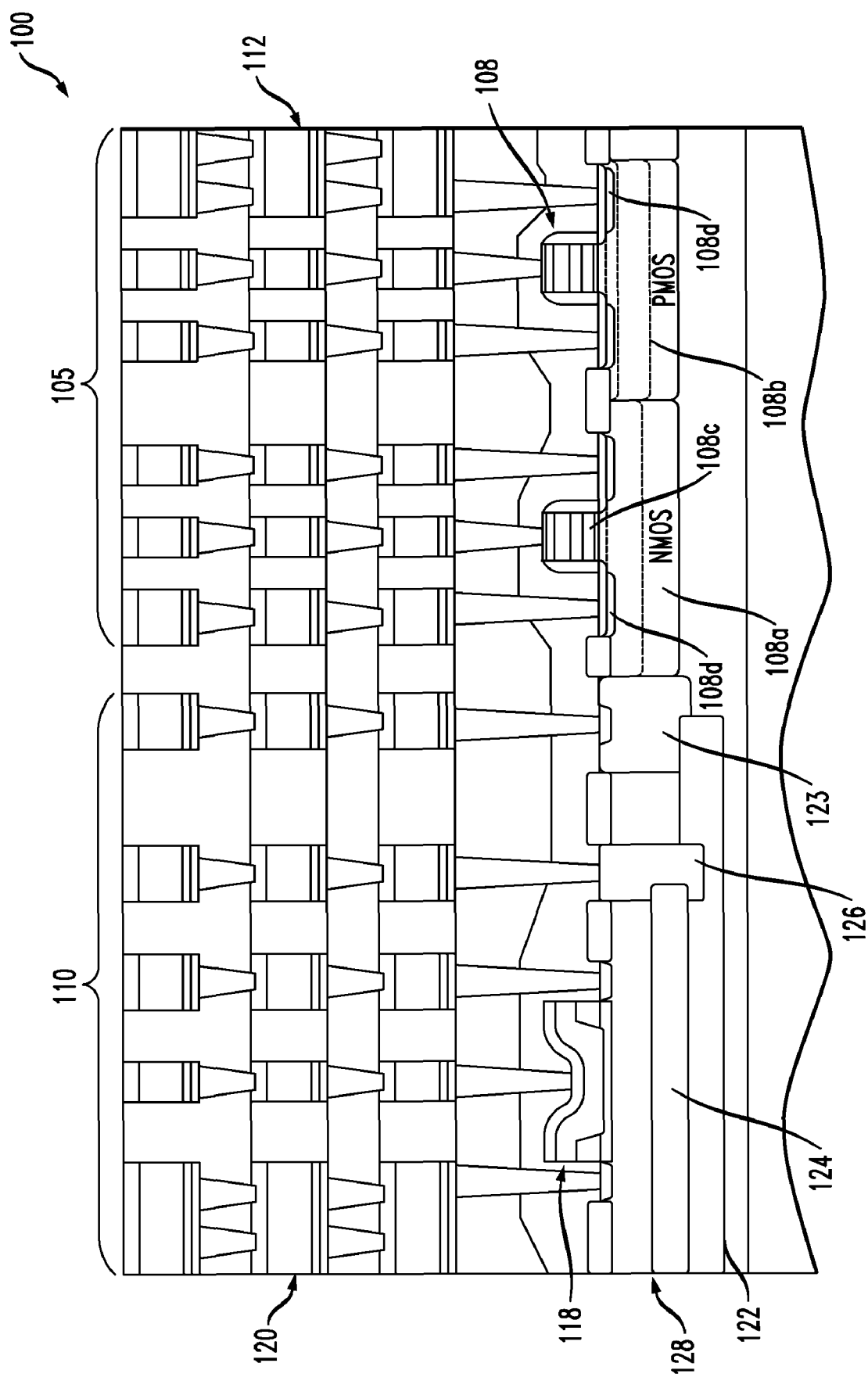
FIG. 1 illustrates a semiconductor device as provided by one embodiment of the invention that is configured as an integrated circuit.

Referring initially to FIG. 1, there is illustrated an embodiment of the semiconductor device 100 of the invention. In this embodiment, the semiconductor device 100 is an integrated circuit (IC) that includes a transistor region 105 comprising non-bipolar transistors 108 (e.g., PMOS or NMOS transistors that are not configured as bipolar devices) and interconnects 112. The region 105 may be of conventional design and, except for the embodiments discussed herein, it may be manufactured with conventional processes and materials known to those skilled in the art. In the illustrated embodiment, the transistors 108 are configured as CMOS devices. However, the transistors 108 may also be configured as all NMOS or PMOS devices. Moreover, it should be understood that though certain dopant schemes are discussed herein, those skilled in the art will understand that they may be reversed or other dopant schemes may be used. In the illustrated embodiment, the transistors 108 are configured as CMOS devices and include an NMOS tub 108a and a PMOS tub 108b and other conventional features, such as a gate electrode 108c and source/drains 108d.

The semiconductor device 100 further includes a bipolar transistor region 110. The region 110 includes a bipolar transistor 118, such as a vertical PNP bipolar transistor, which may be manufactured by one or more, or a combination of the embodiments, as discussed herein. Again, for brevity, only one bipolar transistor 118 is shown, but typically, the device 100 would include a plurality of bipolar transistors 118. The region 110 also includes interconnects 120 that may be fabricated using conventional processes and materials. It should be noted that while separately designated for purposes of pointing to different areas of the device 100, interconnects 112 and 120 can be fabricated simultaneously and with the same deposition processes and materials. The bipolar transistor 118 further comprises an isolation region 122 located under a subcollector 124 and contacts an isolation contact tub 123, such as an N tub. The subcollector 124 contacts a contact tub 126, for example, a P tub. In one embodiment, the contact tub 126 has a higher dopant concentration than that normally found in conventionally formed contact tubs. Thus, the semiconductor device 100 has advantages in that the contact tub 126 has a lower resistance than found in conventionally fabricated devices. Further, as provided by one embodiment, the dopant concentration of the NMOS tub 108a is less than the dopant concentration of the contact tub 126 because the contact tub 126 undergoes additional implantation process to achieve the desired tub dopant concentration as compared to the NMOS tub 108a without affecting the NMOS or PMOS devices.

In another embodiment, the isolation contact tub 123 may also have a higher dopant concentration than that normally found in conventionally formed isolation contact tubs. Thus, the semiconductor device 100 has advantages in that the isolation contact tub 123 may also have a lower resistance than found in conventionally fabricated devices. Further, as provided by one embodiment, the dopant concentration of the PMOS tub 108b is less than the dopant concentration of the isolation contact tub 123 because the contact tub 123 may undergo additional implantation processes to achieve the desired tub dopant concentration as compared to the PMOS tub 108b. This achieved by using the same patterned mask that is used to implant other tub areas in the non-bipolar region 105. In yet another embodiment, both the isolation contact tub 123 and the collector contact tub 126 may have greater dopant concentrations than tubs in the non-bipolar region because of undergoing more than one dopant implant. This is also achieved by using the same patterned mask that is used to implant other tub areas in the non-bipolar region 105.

Figure 2A:
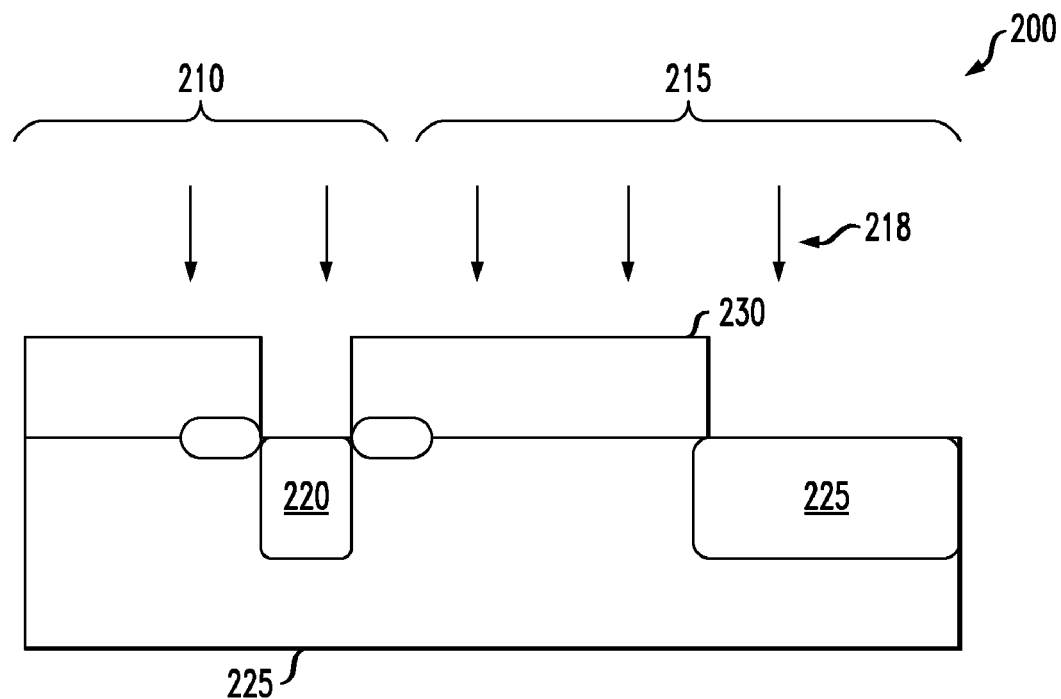
FIGS. 2A-2B illustrate views of one embodiment of a semiconductor device during various stages of fabrication.

FIG. 2A illustrates a partial view of one embodiment of a semiconductor device 200 at one stage of manufacture. This view illustrates a bipolar transistor region 210 and a non-bipolar region 215 undergoing an n-type dopant implant 218 to form tub 220 in the bipolar region 210 and form tub 225 in the non-bipolar region 215. The type of dopant used may be conventional. For example, in one embodiment, the dopant may be phosphorous or arsenic. At this point, other areas of both the bipolar region 210 and the non-bipolar region 215, such as P tub areas, are protected from the implant 218 by a mask 230 that has been patterned to expose the tubs 220 and 225. In one embodiment, the tub 220 may be an N tub that contacts an N-isolation region (NISO) (e.g., 122, FIG. 1), and the tub 225 may be an N tub for a PMOS device, such as a tub for a 1 volt PMOS transistor. In such instances, the mask 230 exposes both the tub 220 in the bipolar region 210 and the N tub regions in the non-bipolar region 215 simultaneously to the implant 218. The dopant dosage of the implant 215 may range from about 5E12 atoms/cm$^2$ to about 5E13 atom/cm$^2$ and the implant energy may range from 200 keV to about 700 kev. It should be noted that the implant 215 and the other implants discussed herein, may be conducted as a single implant or may be conducted as a series of implants in which the implant dosages and energies may be the same or different. Further, while only one tub is shown regarding each device, it should be understood that, typically, multiple tubs would be formed in each of the areas discussed herein.

Figure 2B:
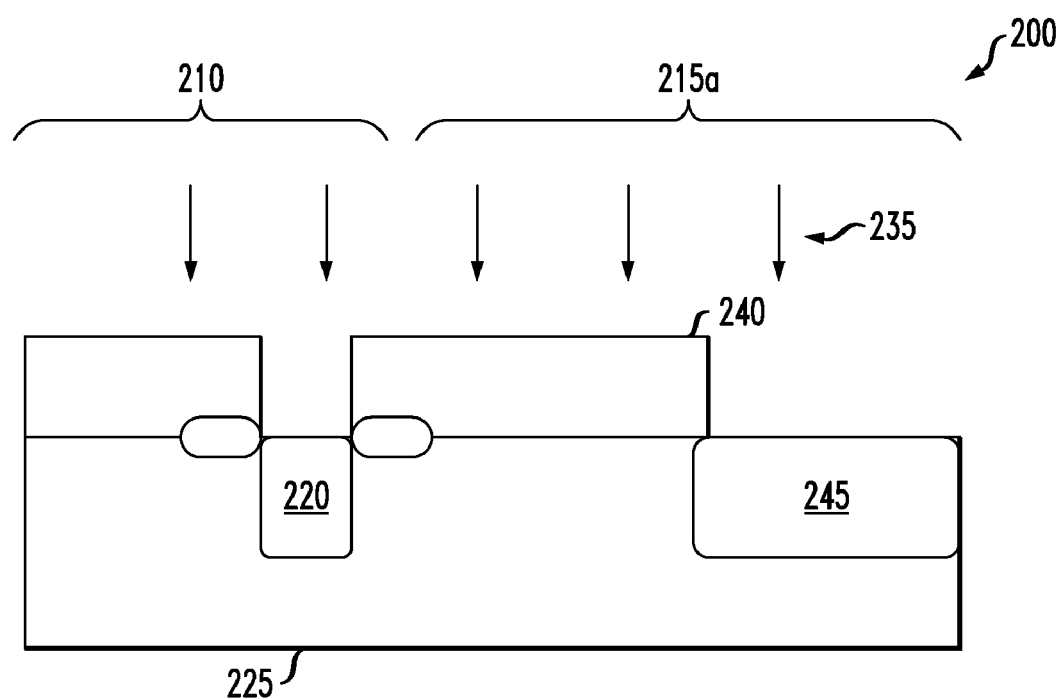

FIG. 2B illustrates a partial view of another embodiment of the semiconductor device 200 of FIG. 2A and after the implant 218 and conventional, removal of mask 230. In this view, the bipolar transistor region 210 and another area 215a of the non-bipolar region are undergoing another n-type dopant implant 235. In this embodiment, another mask 240 is patterned to again expose the tub 220 and the non-bipolar region 215a. This implant places additional dopant in tub 220 in the bipolar region 210 and forms tub 245 in the non-bipolar region 215a. The dopant used may be the same n-type dopants as previously discussed. At this point, P tub regions of both the bipolar region 210 and the non-bipolar region 215a are protected from the implant 220 by a mask 240 that has been patterned to expose the tubs 220 and 245 in their respective regions. As mentioned above, the tub 220 may be an N tub for contacting an N-isolation region (NISO) (e.g., 122, FIG. 1), and the tub 245 may be another N tub for a PMOS device, such as a tub for a 3 volt PMOS transistor. Though certain voltages have been discussed herein, it is for illustrative purposes only, and it should be understood that the different regions of the non-bipolar transistor devices may be configured for various operating voltages.

The mask 240 exposes tub 220 in the bipolar region 210 and 3 volt N tub areas in the non-bipolar region 215a to the implant 235, but protects the other areas of the bipolar region 210, the PMOS 1 volt areas, and NMOS areas of the non-bipolar region 215a from the implant. The dopant dosage of the implant 235 may range from about 5E12 atoms/cm$^2$ to about 5E13 atom/cm$^2$ and the implant energy may range from 200 keV to about 700 kev.

Thus, in the embodiments illustrated in FIGS. 2A-2B, the tub 220 is subjected to a dual implant during the formation of PMOS tubs for transistors having different operating voltages, which is achieved by using the same patterned mask used to simultaneously form tubs in the non-bipolar region 215a. The increased dopant concentration provides a bipolar device with decreased tub resistance without affecting the PMOS or NMOS devices in the non-bipolar region 215 and 215a. The embodiments of FIGS. 2A and 2B may be used singularly or in combination.

Figure 3A:
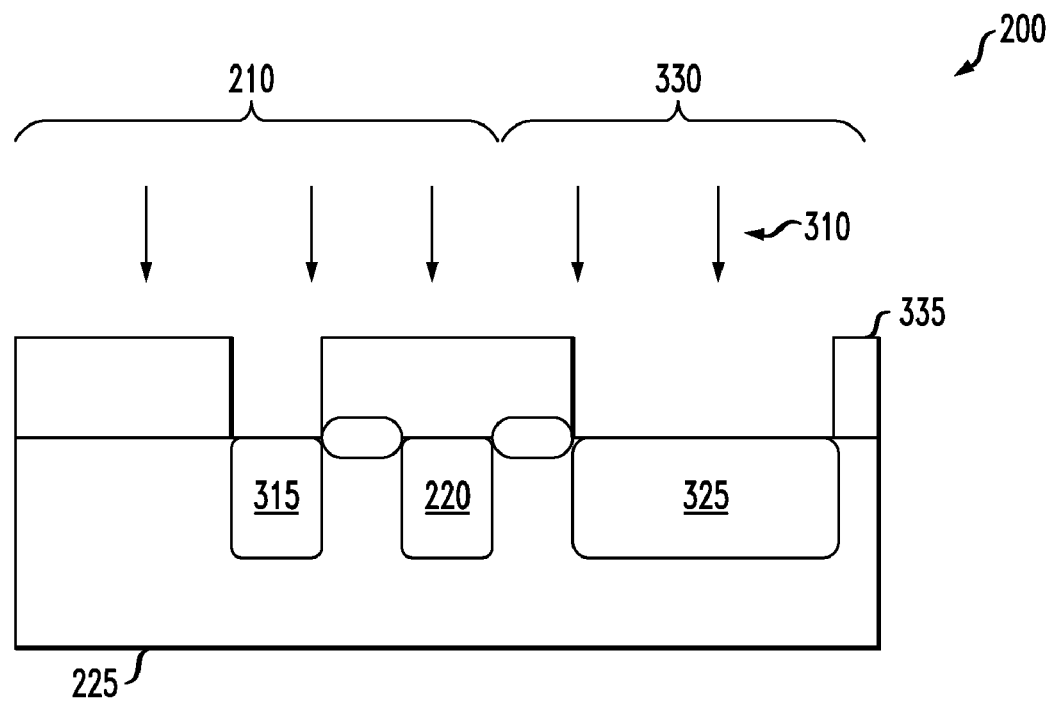
FIGS. 3A-3B illustrates views of another embodiment of a semiconductor device during various stages of fabrication.

FIG. 3A illustrates the semiconductor device 200 after the implant 235 of FIG. 2B, the conventional removal of the mask 240, and during a dopant implant 310 that forms a tub 315 in another portion of the bipolar region 210 and simultaneously forms a tub 325 in another portion of the non-bipolar region.

A patterned mask 335, which may be formed conventionally and with conventional materials, is also shown that protects the previously discussed areas relating to FIGS. 2A-2B from the implant 310 but exposes the tubs 315 and 325, which allows the implant of the p-type dopant.

In the illustrated embodiment, the tub 315 may be a P tub for a collector contact of a bipolar transistor. At this stage of manufacture, the non-bipolar transistor tub 325 may be for an NMOS transistor. The operating voltage configuration of the NMOS transistors may vary depending on design requirements, but as an example, the non-bipolar region 330 of FIG. 3A may be for devices having an operating voltage of about 1 volt.

In those embodiments where the dopant is a p-type dopant, such as boron, a dopant dosage of the implant 310 may range from about 5E12 atoms/cm$^2$ to about 5E13 atoms/cm$^2$, and an implant energy of the implant 310 may range from about 50 keV to about 300 keV. It should be understood that these ranges are given as examples only and that other process parameters may be used, depending on the device's design. Moreover, as mentioned above, the type of dopant used will depend on the type of device formed. In the illustrated embodiment, tubs 315 and 325 are P tubs and boron is used in the implant 310. The mask 335 allows the simultaneous dopant implantation and formation of tub 315 in the bipolar region 210 and tub 325 in the non-bipolar region 330. Thus, the resulting dopant concentrations in the tub 315 and tub 325 will be substantially the same, except for any minor differences in dopant concentrations associated with normal process variations. For example in the above described embodiment, the in-place dopant concentration may range from about 5E16 atoms/cm$^3$ to about 3E18 atoms/cm$^3$ with a depth the dopant concentration ranging from about 0 nm to about 1000 nm. These ranges are also given as examples, and it should be understood that other concentrations may be acheived, depending on the device's design.

Figure 3B:
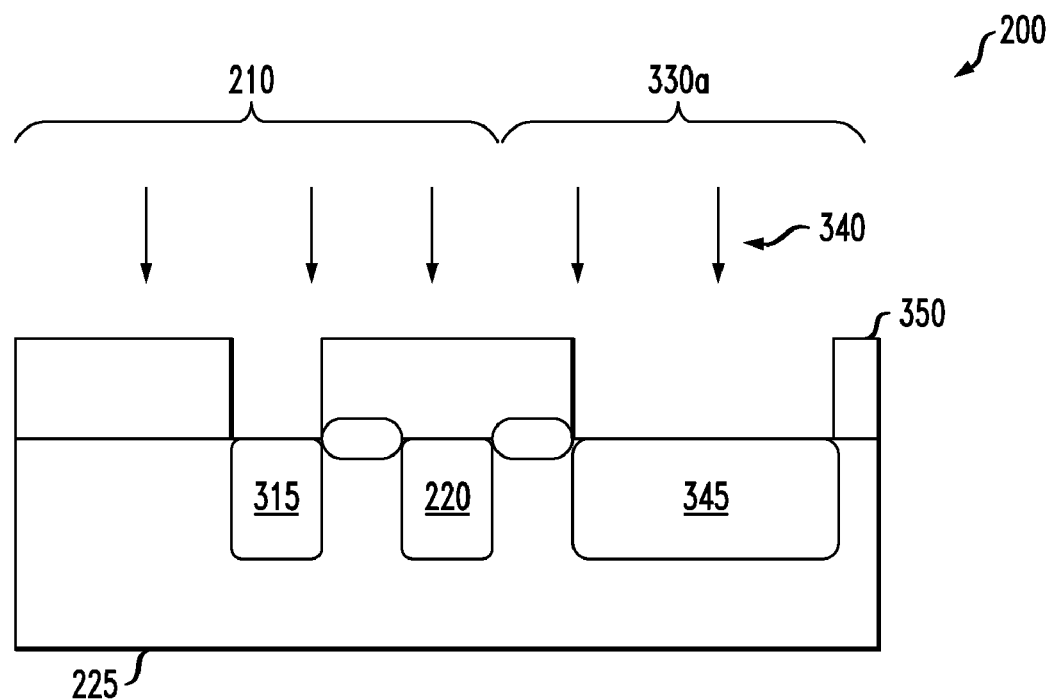

FIG. 3B illustrates the semiconductor device 200 after the implant 315 of FIG. 3A, the conventional removal of the mask 335, and during a dopant implant 340 that places additional dopant in the tub 315 and forms a non-bipolar transistor tub 345 in another non-bipolar region 330a. In one embodiment and at this stage of manufacture, the non-bipolar transistor tub 345 may be for another NMOS transistor, such as a 3 volt NMOS transistor, that is configured to have a higher operating voltage than the transistor in the non-bipolar region 330. A patterned mask 350, which may be formed conventionally and with conventional materials, is also shown that protects other regions of the semiconductor substrate 225 from the implant 340, such as tub 325 of FIG. 3A, and tubs 225 and 245 of FIG. 2A-2B, but exposes the tub 315 and the non-bipolar transistor tub 345 to the implant 340.

In one embodiment, a dopant dosage of the implant 340 may range from about 5E12 atoms/cm$^2$ to about 5E13 atoms/cm$^2$, and at an implant energy ranging from about 50 keV to about 300 keV. It should be understood that these ranges are given as examples only and that other process parameters may be used and will depend on the device's design. Moreover, the type of dopant used will depend on the type of device being formed. In the illustrated embodiment, the dopant is a p-type dopant, such as boron. The mask 350 allows the simultaneous implant of the dopant into the tub 315 and tub 345. Since, the tub 315 has already undergone a previous implant, as discussed above regarding FIG. 3A, the resulting dopant concentrations in the tub 315 will be greater than the dopant concentration of tub 345. For example in the above described embodiment, the dopant concentration for tub 315 may range from about 1E17 atoms/cm$^3$ to about 6E18 atoms/cm$^3$ at a depth that ranges from about 0 nm to about 1000 nm, and the dopant concentration for tub 345 may range from about 5E16 atoms/cm$^3$ to about 3E18 atoms/cm$^3$. These ranges are also given as examples, and it should be understood that other concentrations may also be achieved, depending on the device's design. The embodiments of FIGS. 3A and 3B may be used singularly or in combination.

The dual implantation of tubs 220 and 315 using the same mask that is used to implant the respective regions of the non-bipolar regions 215, 215a, 330 and 330a provide an improved bipolar transistor over conventional devices. Typically, in a masking sequence, when doping a region with a particular dopant, great care is taken to make certain that no other areas of the substrate that are designed to have a different dopant concentration from the one presently being implanted is affected by the implantation. To insure this, careful steps during mask tape-out are conducted. Thus, in conventional processes, those skilled in the art would not expose tubs 220 or 315 to multiple implants because conventional designs provide for these tubs to have the same dopant concentration as the corresponding PMOS or NMOS device. However, in contrast to conventional wisdom, the invention uniquely recognizes an efficient way of decreasing the resistance associated with a bipolar transistor by exposing its tubs to different dosage implants while using the same patterned mask that are used to implant the tubs in non-bipolar regions.

For illustrative purposes, the above descriptions are directed to a vertical PNP bipolar transistor. However, the embodiments described herein may also apply to a vertical NPN bipolar transistor. In the case of an NPN bipolar transistor, the dopant species would be reversed from what was described previously regarding FIGS. 2A-2B and 3A-3B. For example, in a case of vertical NPN bipolar transistor, the collector dopant would be changed from a p-type to an n-type and the isolation contact dopant would be changed from n-type to a p-type.

Figure 4:
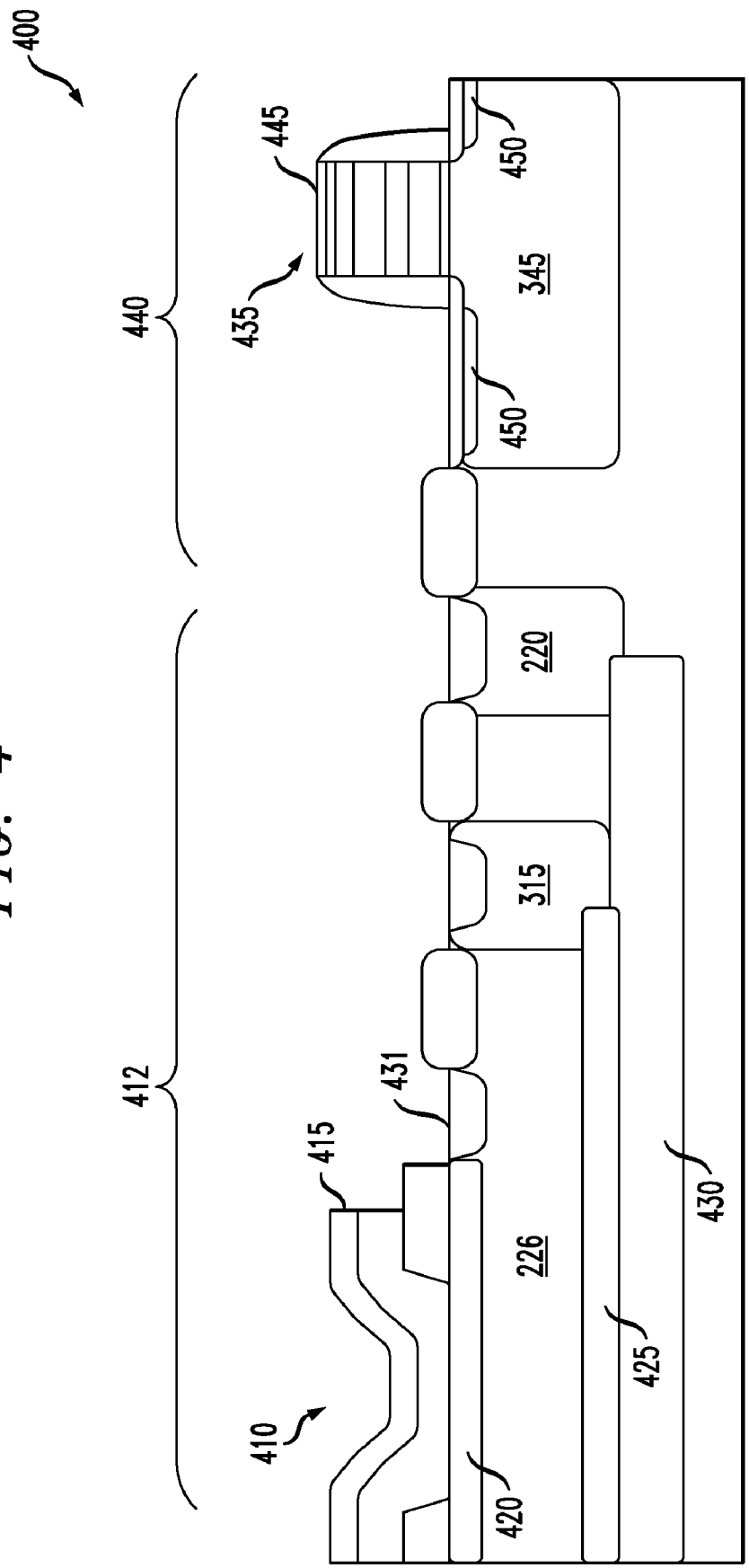
FIG. 4 illustrates a view of a bipolar device and MOS transistor that can be used to fabricate the semiconductor device of FIG. 1.

Following the formation of the different tubs as described above, conventional materials and fabrication processes can be used to arrive at the semiconductor device 400 shown in FIG. 4. The partial view of this embodiment includes a completed bipolar transistor 410, which is located in a bipolar transistor region 412, that includes an emitter 415, a base 420, a subcollector 425, an NISO region 430, and a base contact 431. The subcollector 425 contacts the previously discussed collector contact tub 315 and the NISO region 430 contacts the previously discussed isolation contact tub 220. The semiconductor device 400 also includes a completed MOS transistor 435 that is located in a non-bipolar region 440. The MOS transistor, which may be an NMOS transistor or PMOS transistor as discussed above, may be of conventional design. For example, the transistor 435 will include a gate electrode 445 and source/drains 450 that are located in the previously discussed NMOS P tub 345. The semiconductor device 400 can be incorporated into the structure of FIG. 1 to form an integrated circuit.

Although the present invention has been described in detail, those skilled in the art should understand that they can make various changes, substitutions and alterations herein without departing from the spirit and scope of the invention in its broadest form.

What is claimed is:

1. A method of manufacturing a semiconductor device, comprising:
   forming openings in a first implant mask located over a bipolar region and a first non-bipolar region of a semiconductor substrate to expose a bipolar region portion and the first non-bipolar region;

conducting a first implant through the openings to place a dopant in the semiconductor substrate to form tubs in the bipolar region portion and tubs in the first non-bipolar region;

forming openings in a second implant mask located over the bipolar region portion and a second non-bipolar region to expose the tubs in the bipolar region portion and expose the second non-bipolar region, wherein the tubs of the bipolar region are collector contact tubs for bipolar transistors and the tubs of the first non-bipolar region being protected by the second implant mask; and conducting a second implant through the openings to place the dopant in the tubs in the bipolar region and form tubs in the second non-bipolar region, such that the dopant concentration in the tubs of the bipolar region is greater than the dopant concentration in the tubs of the second non-bipolar region.

2. The method recited in claim 1, wherein the bipolar transistors are vertical bipolar transistors and the tubs in the second non-bipolar region are tubs for NMOS non-bipolar transistors and the method further includes forming a collector for each of the vertical bipolar transistors.

3. The method recited in claim 1, wherein each of the first and second implants includes a series of implants through each of the first and second masks.

4. The method recited in claim 1, wherein a dopant dosage of the first implant ranges from about 5E12 atoms/cm$^2$ to about 5E13 atoms/cm$^2$.

5. The method recited in claim 4, wherein an implant energy of the first implant ranges from about 50 keV to about 300 keV.

6. The method recited in claim 1, wherein a dopant dosage of the second dopant implant ranges from about 5E12 atoms/cm$^2$ to about 5E13 atoms/cm$^2$.

7. The method recited in claim 6, wherein an implant energy of the second implant ranges from about 50 keV to about 300 keV.

8. A semiconductor device, comprising:
a bipolar transistor region, including collector contact tubs located in a semiconductor substrate, the collector contact tubs each having a dopant concentration ranging from about 1E17 atoms/cm$^3$ to about 6E18 atoms/cm$^3$, and wherein the depth of the dopant concentrations ranges from about 0 nm to about 1000 nm; and an non-bipolar transistor region, including transistor tubs located in a semiconductor substrate, source/drains located in each of the transistor tubs, and a gate electrode located over each of the transistor tubs, the transistor tubs having a dopant concentration within the depth range that is less than the collector contact tubs, wherein the vertical bipolar transistors are PNP or NPN vertical bipolar transistors and the transistor tubs are NMOS or CMOS transistor tubs, respectively.

9. The device recited in claim 8, wherein the dopant concentration of the transistor tubs ranges from about 5E16 atoms/cm$^3$ to about 3E18 atoms/cm$^3$.

10. The device recited in claim 8, wherein the bipolar transistor region includes vertical bipolar transistors.

11. The device recited in claim 8, wherein the semiconductor device is an integrated circuit and the semiconductor device further includes:
vertical bipolar transistors, wherein each of the vertical bipolar transistors includes one of the collector contact tubs;

non-bipolar transistors, wherein each of the non-bipolar transistors includes one of the transistor tubs;

dielectric layers located over the non-bipolar transistors and vertical bipolar transistors; and interconnects located in the dielectric layers that electrically connect the non-bipolar and vertical bipolar transistors.

12. A method of manufacturing a semiconductor device, comprising:
forming openings in a first implant mask located over a vertical bipolar transistor region and a first NMOS or CMOS transistor region of a semiconductor substrate to expose a portion of the vertical transistor bipolar region and the first NMOS or CMOS transistor region;

conducting a first implant through the openings to place a dopant in the semiconductor substrate to form tubs in the portion of the vertical bipolar transistor region and the first NMOS or CMOS transistor region;

forming openings in a second implant mask located over the vertical bipolar transistor region and a second NMOS or CMOS transistor region to expose the tubs in the vertical bipolar transistor region and the second NMOS or CMOS transistor region; and conducting a second implant through the openings to place the dopant in the tubs of the vertical bipolar transistor region and form tubs in the second NMOS or CMOS transistor region, such that the dopant concentration in the tubs of the vertical bipolar transistor region is greater than the dopant concentration in the tubs of the second NMOS or CMOS transistor region.

13. The method recited in claim 12, wherein the first and second implants include a series of implants through the first and second masks.

14. The method recited in claim 12, wherein a dopant dosage of the first implant ranges from about 5E12 atoms/cm$^2$ to about 5E13 atoms/cm$^2$.

15. The method recited in claim 14, wherein an implant energy of the first implant ranges from about 50 keV to about 300 keV.

16. The method recited in claim 12, wherein a dopant dosage of the second dopant implant ranges from about 5E12 atoms/cm$^2$ to about 5E13 atoms/cm$^2$.

17. The method recited in claim 16, wherein an implant energy of the second implant ranges from about 50 keV to about 300 keV.

18. The method recited in claim 12, wherein the semiconductor device is an integrated circuit and the method further includes:
forming vertical bipolar transistors in the vertical bipolar transistor region;

forming a first group of NMOS or CMOS transistors configured to have a first operating voltage and a second group of NMOS or CMOS transistors having a second operating voltage in the first and second NMOS or CMOS transistor regions, respectively;

forming dielectric layers over the NMOS or CMOS transistors and the vertical bipolar transistors; and forming interconnects over and within the dielectric layers that electrically connect the NMOS or CMOS transistors and the vertical bipolar transistors.

\* \* \* \* \*